United States Patent
Zama et al.

(10) Patent No.: US 8,147,904 B2
(45) Date of Patent: Apr. 3, 2012

(54) METAL CLAD LAMINATE AND METHOD FOR MANUFACTURING METAL CLAD LAMINATE

(75) Inventors: Satoru Zama, Tokyo (JP); Kenichi Ohga, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/556,143

(22) Filed: Sep. 9, 2009

(65) Prior Publication Data

US 2010/0047517 A1 Feb. 25, 2010

Related U.S. Application Data

(63) Continuation of application No. PCT/JP2008/054859, filed on Mar. 17, 2008.

(30) Foreign Application Priority Data

Mar. 19, 2007 (JP) .................. 2007-071143
Mar. 14, 2008 (JP) .................. 2008-066175

(51) Int. Cl.
*B32B 3/10* (2006.01)
(52) U.S. Cl. .... 427/97.9; 427/99.5; 427/230; 427/383.1
(58) Field of Classification Search .......... 427/504, 427/304, 97.9, 99.5, 437, 443.1, 230, 383.1
See application file for complete search history.

(56) References Cited

U.S. PATENT DOCUMENTS

| | | | | |
|---|---|---|---|---|
| 5,015,517 | A * | 5/1991 | Walsh ........................ | 428/156 |
| 5,156,731 | A * | 10/1992 | Ogasawara et al. ......... | 205/126 |
| 5,178,956 | A * | 1/1993 | Rychwalski et al. ....... | 428/458 |
| 5,246,564 | A * | 9/1993 | Tamiya et al. ............... | 205/169 |
| 5,309,632 | A * | 5/1994 | Takahashi et al. ........... | 29/852 |
| 2004/0134682 | A1 * | 7/2004 | En et al. ..................... | 174/258 |
| 2005/0215086 | A1 * | 9/2005 | Sato et al. ................... | 439/71 |
| 2009/0084167 | A1 * | 4/2009 | Djakov et al. .............. | 73/54.38 |

FOREIGN PATENT DOCUMENTS

JP 05-129377 5/1993

(Continued)

OTHER PUBLICATIONS

Japanese Patent Office, Office Action for Patent Application 2008-066175, Sep. 12, 2008.

(Continued)

*Primary Examiner* — Michael Cleveland
*Assistant Examiner* — Tabassom Tadayyon Eslami
(74) *Attorney, Agent, or Firm* — Kubotera & Associates, LLC

(57) ABSTRACT

A method for manufacturing a metal clad laminate having a film and a metal layer formed of a foundation layer and an upper layer includes the steps of forming the foundation layer on at least a part of a surface of the film by plating to obtain a first laminate; forming the upper layer on the first laminate by plating to obtain a second laminate; and heating the second laminate to obtain the metal clad laminate. Further, the film is a flexible thermoplastic polymer film, the foundation layer is formed of a nickel alloy, the upper layer is formed of copper, at least one of the foundation layer and the upper layer has a compression stress before the step of heating the second laminate, and the metal clad laminate shrinks in a planar direction of the film during the step of heating the second laminate.

6 Claims, 6 Drawing Sheets

FOREIGN PATENT DOCUMENTS

| | | |
|---|---|---|
| JP | 07-243085 | 9/1995 |
| JP | 2003-183430 | 7/2003 |
| JP | 2004-307980 | 11/2004 |
| JP | 2006-135179 | 5/2006 |
| JP | 2006-137011 | 6/2006 |
| JP | 2006-351646 | 12/2006 |
| WO | PCT/GB2007/000887 | * 9/2007 |

OTHER PUBLICATIONS

Japanese Patent Office, Office Action for Patent Application 2008-066175, Jan. 5, 2009.

Japanese Patent Office, Office Action for Patent Application 2008-066175, Jun. 12, 2009.

* cited by examiner

| | Plating Solution | Electroless Plating Seed | P Concentration (%) | Copper Plating Thickness before Heat Treatment | Heat Treatment Processing | Film Stress of First Laminate or Second Laminate (MPa) | Change in Size due to Heat Treatment (%) | Size Stability during Conductor Etching (%) | Circuit Etching Characteristics (Surface Resistance) | Note |
|---|---|---|---|---|---|---|---|---|---|---|
| Embodiment 1 | Meltex Ni-426 | Ni-P | 4.2 | 5 | After Copper Electroplating | -20 | -0.01 | 0.011 | ○ | |
| Embodiment 2 | Meltex Ni-426 | Ni-P | 4.7 | 5 | After Copper Electroplating | -25 | -0.02 | 0.008 | ○ | |
| Embodiment 3 | Okuno LPH-LF | Ni-P | 1.8 | 5 | After Copper Electroplating | -38 | -0.07 | 0.006 | ○ | |
| Embodiment 4 | Okuno LPH-LF | Ni-P | 1.8 | 5 | After Copper Electroplating | -40 | -0.09 | 0.005 | ○ | |
| Embodiment 5 | Meltex Ni-426 | Ni-P | 4.2 | - | After Foundation Plating | -40 | -0.11 | 0.004 | ○ | |
| Embodiment 6 | Meltex Ni-426 | Ni-P | 4.7 | - | After Foundation Plating | -65 | -0.16 | 0.003 | ○ | |
| Embodiment 7 | Okuno LPH-LF | Ni-P | 1.6 | - | After Foundation Plating | -72 | -0.21 | 0.002 | ○ | |
| Embodiment 8 | Okuno LPH-LF | Ni-P | 1.8 | - | After Foundation Plating | -86 | -0.25 | 0.001 | ○ | |
| Embodiment 9 | Okuno LPH-LF | Ni-P | 1.9 | - | After Foundation Plating | -92 | -0.28 | 0.003 | ○ | |
| Embodiment 10 | Okuno LPH-LF | Ni-P | 1.9 | 1 | After Copper Electroplating | -78 | -0.22 | 0.002 | ○ | |
| Embodiment 11 | Okuno LPH-LF | Ni-P | 1.9 | 1 | After Copper Electroplating | -87 | -0.24 | 0.002 | ○ | |
| Embodiment 12 | Meltex Ni-865 | Ni-P | 6.5 | - | After Foundation Plating | -56 | -0.14 | 0.002 | △ | |
| Embodiment 13 | Meltex Ni-865 | Ni-P | 7.6 | - | After Foundation Plating | -85 | -0.26 | 0.003 | △ | |
| Comparison Example 1 | Meltex Ni-426 | Ni-P | 2.2 | 5 | After Copper Electroplating | -18 | 0 | 0.014 | ○ | |
| Comparison Example 2 | Meltex Ni-426 | Ni-P | 1.5 | 5 | After Copper Electroplating | -10 | 0.02 | 0.015 | ○ | |
| Comparison Example 3 | Rohm and Haas Omni Shield 1580 | Ni-P | 5.5 | - | After Foundation Plating | 23 | 0.05 | 0.018 | ○ | |
| Comparison Example 4 | Rohm and Haas Omni Shield 1580 | Ni-P | 6.2 | - | After Foundation Plating | 45 | 0.1 | 0.022 | △ | |
| Comparison Example 5 | Rohm and Haas Cuposit Copper Mix | Cu | - | - | After Foundation Plating | 36 | 0.15 | 0.028 | ○ | |
| Comparison Example 6 | Rohm and Haas Cuposit Copper Mix | Cu | - | - | After Foundation Plating | 25 | 0.18 | 0.035 | ○ | |
| Comparison Example 7 | Uyemura LPX | Ni-P | 4 | - | After Foundation Plating | -113 | -0.32 | 0.004 | ○ | |
| Comparison Example 8 | Uyemura LPX | Ni-P | 4.7 | - | After Foundation Plating | -120 | -0.35 | 0.005 | ○ | |
| Comparison Example 9 | Uyemura LPX | Ni-P | 4.8 | - | After Foundation Plating | -123 | -0.36 | 0.004 | ○ | Partial Swelling Defect Occurred during Plating to the Film |

FIG. 4

METAL CLAD LAMINATE AND METHOD FOR MANUFACTURING METAL CLAD LAMINATE

CROSS-REFERENCE TO RELATED APPLICATIONS

This is a continuation application of PCT/JP2008/054859 filed on Mar. 17, 2008, which claims priority from Japanese patent applications No. 2007-071143, filed on Mar. 19, 2007, and No. 2008-066175, filed on Mar. 14, 2008, the entire content of which is incorporated herein by reference.

TECHNICAL FIELD

The present invention relates to a metal clad laminate and a method for manufacturing a metal clad laminate. In particular, the present invention relates to a method for manufacturing a metal clad laminate capable of improving adhesion between a flexible thermoplastic polymer film and a metal layer and dimensional stability during conductor etching.

BACKGROUND TECHNOLOGY

A film metal clad laminate, in which a metal layer (a foundation metal layer/an upper metal electric conductive layer) is formed on a polyimide resin film with excellent heat resistance, has been used for flexible circuit boards. The foundation metal layer is formed of nickel, etc., and the upper metal electric conductive layer is formed of Cu, etc. The film has high water absorption, and dimensional stability thereof worsens under humid atmosphere. Accordingly, as a replacement of the film, a liquid crystal polyester film with excellent heat resistance and low water absorption is focused.

The liquid crystal polyester film is said to have poor adhesion with a metal layer (for example, Ni layer/Cu layer). Therefore, Patent Reference 1 has proposed a method for manufacturing a metal clad laminate for improving adhesion between the film and the metal layer through a heat treatment.

Patent Reference 2 has proposed a method for manufacturing a metal clad laminate for improving an adherence strength between a liquid crystal polyester film and a electrically conductive metal film, in which a surface of the liquid crystal polyester film is roughened with an etching liquid, and then the metal clad laminate is heated at a predetermined temperature within a range from 100° C. to a temperature near a liquid crystal transition point temperature after an electrically conductive metal film is formed on the roughened surface of the film with a plating method.

Patent Reference 1: Japanese Patent Publication No. 3693609
Patent Reference 2: Japanese Patent Publication No. 2004-307980

The liquid crystal polyester film has crystal orientation in a planar direction thereof. Accordingly, the film itself tends to slightly expand in the planar direction thereof after the heat treatment. Therefore, in the above method, when a nickel alloy is plated on the film as a base foundation layer, a dimensional of the metal clad laminate becomes large when a circuit is formed through conductor etching. That is, the metal clad laminate has poor dimensional stability, and is not suitable for forming a fine circuit. Moreover, the adherence strength between the liquid crystal polyester film and the electrically conductive metal layer is not practically sufficient.

An object of the present invention is to solve the above problems, and to provide a method for manufacturing a metal clad laminate capable of improving adhesion of a flexible thermoplastic polymer film with a metal layer and dimensional stability during the conductor etching.

SUMMARY OF THE INVENTION

According to a first aspect of the present invention, a method for manufacturing a metal clad laminate having a film and a metal layer formed of a foundation layer and an upper layer, comprises the steps of: forming the foundation layer on at least a part of a surface of the film by plating to obtain a first laminate; forming the upper layer on the first laminate by plating to obtain a second laminate; and heating the second laminate to obtain the metal clad laminate. Further, the film is a flexible thermoplastic polymer film, the foundation layer is formed of a nickel alloy, the upper layer is formed of copper, at least one of the foundation layer and the upper layer has a compression stress before the step of heating the second laminate, and the metal clad laminate shrinks in a planar direction of the film during the step of heating the second laminate.

In the first aspect, the plated layers, i.e., the foundation layer and the upper layer, are shrunk with the heat treatment, thereby suppressing expansion of the film during the heat treatment. Accordingly, it is possible to improve dimensional stability during a conductor etching.

Moreover, during the plating step, a stress of the plated layers becomes compression stress, and therefore, it is possible to prevent the metal film from detaching off. After the heat treatment, the compression stress during the film plating is released and a tensional stress is generated. Accordingly, the metal film shrinks, thereby increasing an anchor effect with the film. That is, it is possible to increase adherence between the film and the metal layer.

According to a second aspect of the present invention, a method for manufacturing a metal clad laminate having a film and a metal layer formed of a foundation layer and an upper layer, comprises the steps of: forming the foundation layer on at least a part of a surface of the film by plating to obtain a first laminate; heating the first laminate; and forming the upper layer on the first laminate by plating to obtain the metal clad laminate. Further, the film is a flexible thermoplastic polymer film, the foundation layer is formed of a nickel alloy, the upper layer is formed of copper, the foundation layer has a compression stress before the step of heating the first laminate, and the metal clad laminate shrinks in a planar direction of the film during the step of heating the first laminate.

In the second aspect, it is possible to greatly shrink the plated layers with the heating treatment. That is, the plated layers greatly shrink with the heat treatment, thereby suppressing expansion of the film during the heat treatment. Therefore, it is possible to improve dimensional stability during a conductor etching. Moreover, a stress of the film is controlled with the heating treatment during and after the plating process. Accordingly, it is possible to prevent the metal film from peeling due to the stress, and to improve adhesion between the film and the metal layer.

During the plating process, the film receives a compression stress, and therefore, it is possible to prevent the metal film from peeling off. After the heating process, the compression stress is released and the tension stress is generated. Accordingly, the metal film shrinks, and it is possible to increase an anchor effect with the film. That is, it is possible to improve adhesion between the film and the metal layer.

According to a third aspect of the present invention, in the method for manufacturing the metal clad laminate in the first or the second aspect, the first laminate shrinks by 0.1% to 0.3% in the planar direction of the film in the step of heating the first laminate.

In the third aspect, the dimensional stability during the conductor etching can be further improved. When the shrinkage is less than 0.1%, the shrinkage amount is not sufficient, and the dimensional stability is not enough. When the shrinkage is larger than 0.3%, the stress in the film becomes too large, and a swelling defect may occur during the plating formation process.

According to a fourth aspect of the present invention, in the method for manufacturing the metal clad laminate in one of the first to the third aspects, the foundation layer has a compression stress of 70 MPa or more.

In the fourth aspect, during the plating process, the film receives a compression stress, and therefore, it is possible to prevent the metal film from peeling off. When the compression stress is smaller than 70 MPa, the shrinkage amount by the heat treatment tends to become small.

According to a fifth aspect of the present invention, in the method for manufacturing the metal clad laminate in one of the first to the fourth aspects, the foundation layer is formed of the nickel alloy containing phosphorous of 6 mass % or less.

In the fifth aspect, it is possible to obtain high adhesion with the film and stable conductor etching. When phosphorous is contained more than 6 mass %, a residue of the foundation metal tends to remain during the conductor etching. It is preferable to contain phosphorous in the nickel alloy less than 4%. It is more preferable to contain phosphorous in the nickel alloy less than 3%.

According to a sixth aspect of the present invention, in the method for manufacturing the metal clad laminate in one of the first to the fifth aspects, wherein the film is the polymer film capable of forming a melting phase having optical anisotropy.

In the sixth aspect, molecules of the film have an anisotropy characteristic, and rod-like molecules called a mesogenic group are dispersed uniformly in the planer direction during the formation of the film. Therefore, while a coefficient of thermal expansion in the planer direction is approximately 16 ppm, a coefficient of thermal expansion in a thickness direction is large, approximately 200 ppm. An arrangement of the molecules collapses during the heat treatment, and the film tends to slightly expand in the planar direction thereof.

In the sixth aspect, the metal film shrinks in the heat treatment to improve adhesion with the film. Accordingly, the film preferably expands during the heating treatment. When the film is formed of the liquid crystal polymer, it is possible to increase adhesion and dimensional stability.

According to a seventh aspect of the present invention, the method for manufacturing the metal clad laminate in one of the first to the sixth aspects further comprises the step of forming the foundation layer on at least a part of an inner wall of a through hole formed in the film.

In the seventh aspect, the plating layer is simultaneously formed on the film surface and the inner wall of the through hole, thereby improving connection reliability of the through hole.

In general, after forming a double-sided metal clad laminate, a through hole is formed with a drill or a laser. Afterward, the through hole is made electrically conductive through electroless plating and electroplating. In the drill processing, a metal burr may adhere to an inner wall of the through hole, thereby deteriorating connection reliability. In the laser processing, a hole is formed in a metal layer with a laser wavelength different from that suitable for opening the through hole in the film. Accordingly, when a single laser is used, the through hole may have an irregular shape (different opening diameters between a front surface and a backside surface, or a distorted oval opening), and it takes longer time.

In the seventh aspect of the invention, it is possible to simultaneously make the film surface and the inner wall of the through hole electrically conductive. Accordingly, it is possible to improve reliability, and to easily form the metal clad laminate with the through hole.

According to an eighth aspect of the present invention, a metal clad laminate includes a film; and a metal layer formed on at least a part of a surface of the film and having a foundation layer formed of a nickel alloy and an upper layer formed of copper. Further, the film shrinks in a planar direction thereof.

In the eighth aspect, the film of the metal clad laminate shrinks in the planar direction thereof. Accordingly, it is possible to reduce expansion of the film relative to the metal clad laminate during the heat treatment, thereby improving dimensional stability during a conductor etching. Further, when the film shrinks in the planar direction thereof, the metal layer shrinks. Accordingly, it is possible to increase an anchor effect with the film, thereby improving adhesion between the film and the metal layer.

According to a ninth aspect of the present invention, in the metal clad laminate in the eight aspect of the present invention, the film shrinks in the planar direction thereof by 0.1% to 0.3%.

In the ninth aspect, the dimensional stability during the conductor etching can be further improved. When the shrinkage is less than 0.1%, the shrinkage amount is not sufficient, and the dimensional stability is not enough. When the shrinkage is larger than 0.3%, the stress in the film becomes too large, and a swelling defect may occur during the plating formation process.

According to a tenth aspect of the present invention, in the metal clad laminate in the eighth or the ninth aspect of the present invention, the film has a through hole for electrical connection formed in a thickness direction thereof, and the foundation layer is formed on at least the part of the surface of the film and at least a part of an inner wall of the through hole.

In the tenth aspect, the plating layer is simultaneously formed on the film surface and the inner wall of the through hole, thereby improving connection reliability of the through hole.

According to an eleventh aspect of the present invention, in the metal clad laminate according to one of the eighth to the tenth aspects of the present invention, the film is a polymer film capable of forming a melting phase having optical anisotropy.

In the eleventh aspect, molecules of the film have an anisotropy characteristic, and rod-like molecules called a mesogenic group are dispersed uniformly in the planer direction during the formation of the film. Therefore, while a coefficient of thermal expansion in the planer direction is approximately 16 ppm, a coefficient of thermal expansion in a thickness direction is large, approximately 200 ppm. An arrangement of the molecules collapses during the heat treatment, and the film tends to slightly expand in the planar direction thereof.

In the eleventh aspect, the metal film shrinks in the heat treatment to improve adhesion with the film. Accordingly, the film preferably expands during the heating treatment. When the film is formed of the liquid crystal polymer, it is possible to increase adhesion and dimensional stability.

According to a twelfth aspect of the present invention, in the metal clad laminate according to one of the eighth to the eleventh aspects of the present invention, the foundation layer is formed of the nickel alloy containing phosphorous of 6 mass % or less.

In the twelfth aspect, it is possible to improve adhesion with the film, and to obtain stable conductor etching characteristic. When phosphorous is contained more than 6 mass %, a residue of the foundation metal tends to remain during the conductor etching, thereby deteriorating insulation.

According to the present invention, the foundation metal layer is formed of the nickel-alloy. The plated layers are formed so as to generate the compression stress, and shrink with the heat treatment. Accordingly, it is possible to produce the metal clad laminate with excellent dimensional stability during the conductor etching. Further, the film of the metal clad laminate shrinks in the planar direction thereof, thereby improving the anchor effect with the film.

BRIEF DESCRIPTION OF THE DRAWINGS

FIGS. 1(a) to 1(c) are sectional views showing a method for manufacturing a metal clad laminate according to an embodiment of the present invention, wherein FIG. 1(a) is a sectional view showing a film in a state before a foundation layer is formed thereon, FIG. 1(b) is a sectional view showing a first laminate in which the foundation layer is formed on the film, and FIG. 1(c) is a sectional view showing a second laminate in which an upper layer in formed on the foundation layer;

FIG. 4 is a table showing dimensional stability of the metal clad laminate during a conductor etching process;

DETAILED DESCRIPTION OF PREFERRED EMBODIMENTS

Embodiments of the present invention will be described with reference to the drawings. It is noted that the embodiments described below are for explanation and do not limit the scope of the present invention.

Figure 1A:
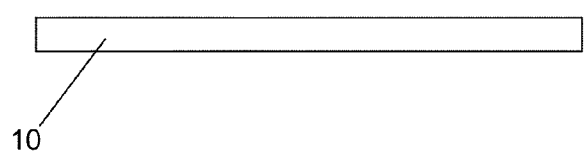
Figure 1B:
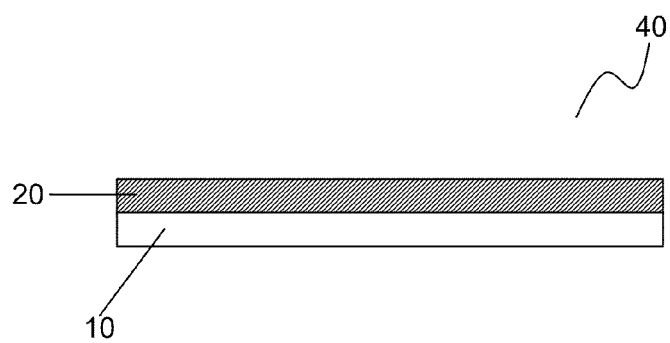
Figure 1C:
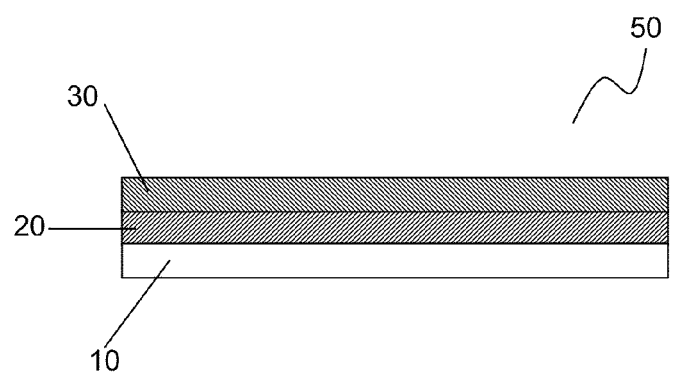
Figure 2A:
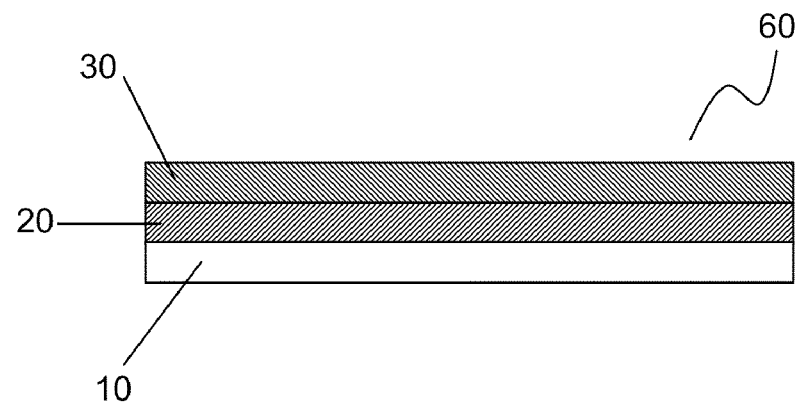
FIG. 2(a) is a sectional view showing the metal clad laminate according to the embodiment of the present invention.

FIGS. 1(a) to 1(c) are sectional views showing a method for manufacturing a metal clad laminate 60 according to an embodiment of the present invention. FIG. 2(a) is a sectional view showing the metal clad laminate 60 according to the embodiment of the present invention.

More specifically, FIG. 1(a) is a sectional view showing a film 10 in a state before a foundation layer 20 is formed thereon, FIG. 1(b) is a sectional view showing a first laminate 40 in which the foundation layer 20 is formed on the film 10, and FIG. 1(c) is a sectional view showing a second laminate 50 in which an upper layer 30 in formed on the foundation layer 20.

As shown in FIG. 1(a), in the method for manufacturing the metal clad laminate 60, first a foundation layer 20 which is a metal layer comprised of a nickel alloy is formed on at least a part of a surface of the film 10 formed of a flexible thermoplastic polymer, thereby obtaining the first laminate 40. The foundation layer 20 may be formed on the film 10 in an entire are thereof or an area where a circuit pattern, for example, is formed.

In the next step, as shown in FIG. 1(b), the upper layer 30 which is a metal layer comprised of copper is formed on the first laminate 40 by plating, thereby obtaining the second laminate 50 as shown in FIG. 2(a).

The second laminate 50 is a laminate in which copper is plated on the first laminate 40. The metal clad laminate 60 is manufactured by performing the heat treatment after forming the first laminate 40 or after forming the second laminate 50, and changing a compression stress of the plated layers, i.e., the foundation layer 20 and the upper layer 30, into a tension stress upon the formation.

Figure 2B:
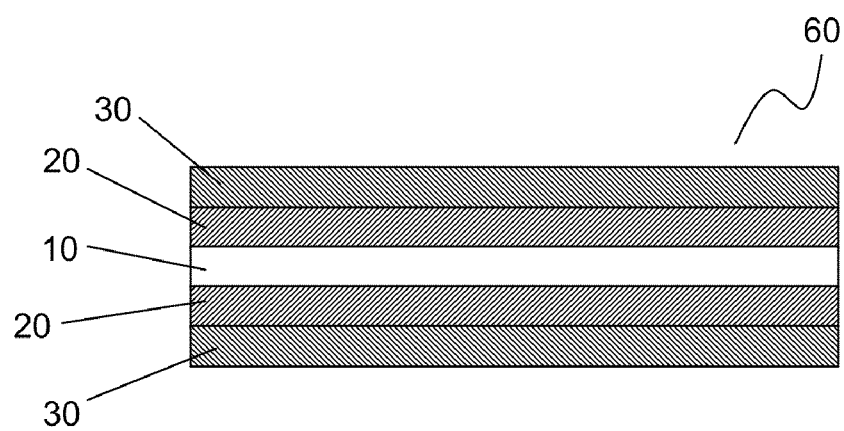
FIG. 2(b) is a sectional view showing a modified example of the metal clad laminate according to the embodiment of the present invention.

FIG. 2(b) is a sectional view showing a modified example of the metal clad laminate 60 according to the embodiment of the present invention. As shown in FIG. 2(b), the foundation layer 20 and the upper layer 30 may be formed on a backside surface of the film 10. In this case, the metal clad laminate 60 has a double-sided structure.

As described above, the expansion of the polymer film 10 by the heat treatment is reduced by changing the stress in the plated layers from compression stress to the tension stress by the heat treatment. Thereby, the metal clad laminate 60 excellent in the dimensional stability during the conductor etching can be created.

It is desirable to perform the heat treatment after the formation of the first laminate 40 and to perform the formation of the second laminate 50 after the heat treatment. This is because the shrinkage amount by the heat treatment of the plated layers becomes large by heat treating only the foundation layer 20. Therefore, the dimensional stability during the conductor etching can be further improved.

Moreover, the thermoplastic film is used so that it easily becomes soft to deform at high temperature. The deformation resistance of the film 10 at a high temperature is small, and the stress in the plated layers influences the deformation of the metal clad laminate 60.

The shrinkage amount of the first laminate 40 that underwent the heat treatment or the second laminate 50 is preferably 0.1%-0.3%. As to the formation of the first laminate 40, the foundation layer 20 preferably has compression stress of 70 MPa or more. Furthermore, it is desirable to contain phosphorous of 6 mass % or less in the nickel alloy of the foundation layer 20.

When a through hole for electrical connection is formed in the film 10 in advance, techniques such as laser processing, drill processing, and etching with strong alkali can be used.

Furthermore, a thermoplastic polyimide film, a polyester film, etc., can be used as the above flexible thermoplastic polymer film. Among polyester films, polyethylene naphthalate (PEN) is suitable because it has good heat resistivity compared to polyethylene terephthalate (PET).

In particular, thermoplastic polymers which can form optical anisotropic melting phase, that is, so-called thermoplastic liquid crystal polymers, are suitable since they have heat resistive temperature as high as about 300° C. and can well endure the heat treatment. Moreover, although a heat resistance is inferior a little, polyetheretherketone (PEEK) polymers are also suitable as a thermoplastic resin although their heat resistivity slightly worsens. The polymer films can undergo wet plating since they all have low water absorbability characteristics.

In the embodiment, it is possible to manufacture the metal clad laminate 60 with improved adhesion between the film 10 and the metal layer by roughening a surface of the film 10.

Here, as for the roughening method of the film surface, for example, a method which dips the film 10 into an etching liquid is easy and is desirable. A strong alkali solution, a permanganate solution, a chromate solution, etc., are used for the etching liquid. Especially in a thermoplastic liquid crystal polymer film, it is effective if a strong alkali solution is used. Moreover, if the film 10 is difficult to etch, mechanical polishing methods, such as a sandblast, are effective.

The metal clad laminate 60 can be used as a single sided flexible substrate by forming the metal layer only in one side of the base material film, and also as a double sided flexible substrate by forming the metal layer in both sides of the base material film. Moreover, a plurality of laminates in which the metal layer is formed only in one side may be stacked for use as a multilayer substrate.

The heat treatment can be done using, for example, a hot air drying furnace, an infrared heater furnace, and the heated metal roll. Moreover, the heat treatment may be done in batch by putting the subject onto wire gauze etc., and may be done by moving a roll-like film continuously.

Embodiments will be described next in more detail.

Embodiments

The embodiments with respect to the size change of the metal clad laminate by the heat treatment and the dimensional stability during the conductor etching will be described. The measurement of the rate of change in the size of metal clad laminates, the analysis of elements of the plated layers, and the stress measurement of the plated layers are as follows:

The measurement of the rate of change in the size of metal clad laminates was done based on the dimensional stability of JIS C 6471, or the measuring method described in IPC-TM650 2.2.4. The above-described measuring method measures by creating mark-off lines, or by creating evaluation mark patterns which were made by printing and etching. Alternatively, the rate of change in the size may be obtained by creating a through hole and using its center as the evaluation mark.

Moreover, the phosphorous concentration measurement and the measurement of plating thickness for nickel-phosphorus performed as an analysis of plated layers element were done using inductively coupled plasma luminescence analysis equipment (ICP). The nickel-phosphorus film was dissolved with nitric acid, and the mass analysis was performed using the ICP.

Moreover, the phosphorous concentration measurement and the measurement of plating thickness of the nickel-phosphorus performed as an analysis of plated layers element were quantified using a fluorescence X-ray analysis device. As for the analysis device, a fluorescence X-ray analysis device SEA5120A manufactured by SEIKO Precision Inc. was used to measure the weight of nickel and phosphorous, respectively, and to obtain the phosphorus concentration. Based on this amount of elements, the density of a nickel-phosphorus alloy was assumed as 8.9 for simplicity to convert it into the film thickness.

Moreover, as for the stress measurement of plated layers, it was done using spiral examination described in JIS H8626. The stress directions (compression or tension) of plated layers were determined using a spiral stress meter of Yamamoto Mekki Shikenki Co., Ltd., to measure the stress values. Since the variation of stress value of the film becomes large if film thickness is thin, as for the stress measurement of the foundation layer by the plating (first laminate), the stress when formed in a bath load 1 dm$^2$/L for plating period of 30 minutes was assumed as the stress of the plated layers of the foundation layer.

When forming a part of the upper layer before the heat treatment, after forming a uniform thickness of the foundation layer by electroless plating, the laminate was further formed in the copper-electroplating bath as an upper layer, and obtained film stress by the similar spiral examination.

The surface resistance was measured as an evaluation of the etching residue upon formation of the circuit. As to the etching characteristics of the film, the surface resistivity was obtained by the method described in IPC TM-650 2.5.17 (also described in ASTM-D-257), and those having the surface resistivity $10^{-13}\Omega$ or less is assumed as excellent, above $10^{-13}\Omega$ and less than $10^{-11}\Omega$ is assumed as good, and $10^{-11}\Omega$ or greater is assumed as defective. When the etching characteristics of a film are not good, the residue of the foundation metal remains on the film by etching, and reduces the resistivity value.

First, Vecster CT with a thickness of 50 μm, manufactured by Kuraray Co., Ltd., is used as the polymer film (liquid crystal polymer film). This polymer film is cut to 240 mm×300 mm, and is dipped into potassium hydroxide solution of 10 N (normal) for 15-30 minutes at 80° C., and unevenness is formed in the surface.

Next, conditioner treatment, electroless plating processing of a nickel alloy, heat treatment, and a copper electroplating processing was performed in this order to manufacture the film metal clad laminate.

As to the conditioner treatment, the surface of the polymer film was washed with OPC-350 conditioner manufactured by Okuno Chemical Industries Co., Ltd. Here, OPC-80 catalyst manufactured by Okuno Chemical Industries Co., Ltd. was used as a liquid for providing a catalyst including palladium, and OPC-500 accelerator was used as the activator.

In the electroless plating processing of nickel alloys, nickel-phosphorus plating was performed to both sides of the film. As to the plating solution of 5% or less of phosphorus concentrations, it was selected from commercial nickel-phosphorus plating solution. The stress of plated layers was measured by the spiral examination. The film stress was controlled by changing the bath temperature, pH, the number of turns for the plating solution, the ratio of hypophosphorous acid and metal nickel, etc.

As for the heat treatment, the film metal clad laminate was put into the heat treatment bath, and retained at a heat treatment temperature, 240° C. for 10 minutes.

As to the copper electroplating processing, copper was formed so that the thickness of the conductor becomes 5 μm. As to the copper-electroplating solution, the following was used. In addition, CU-BRITE TH-Rm manufactured by Ebara-Udylite Co., Ltd. was used as an additive.

As to other films, 50 μm of Teijin Tetron G2 manufactured by Teijin duPont Films Japan Ltd. were used as PET. As to PEN, 50 μm of Teonex Q83 manufactured by Teijin duPont Films Japan Ltd. was used. As to PEEK, 50 μm of IBUKI manufactured by Mitsubishi Plastics Industries, Ltd. were used.

The heat treatment temperatures were set 35-85° C. lower than the melting points of the films as follows: 209° C. for PET (melting point 256° C.), 225° C. for PEN (melting point 272° C.), and 288° C. for PEEK (melting point 335° C.). The liquid crystal polymer underwent 240° C. processing and the melting point was 310° C. Using the films, the same processing as the liquid crystal polymer was performed in copper sulfate of 120 g/L, sulfuric acid of 150 g/L, and concentrated hydrochloric acid of 0.125 mL/L (as chlorine ion).

Figure 3:
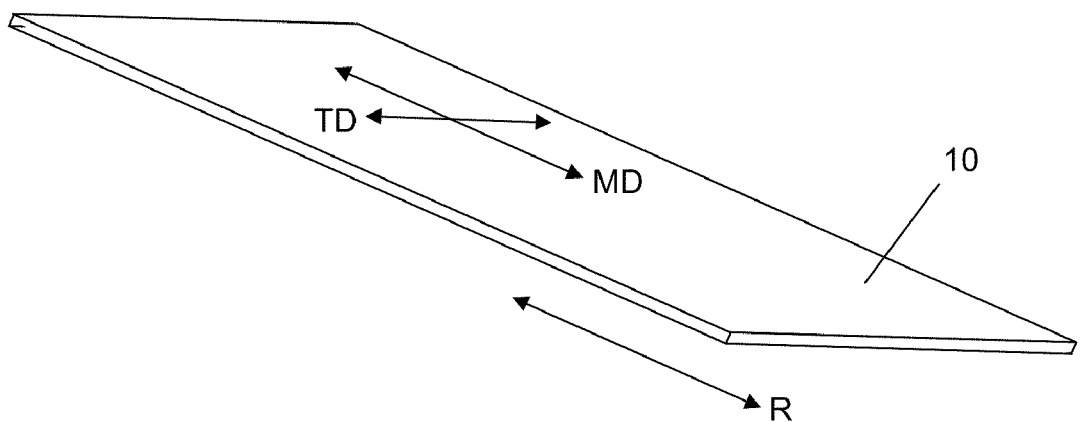
FIG. 3 is a plan view showing the film with directions for measuring a dimensional change thereof according to the embodiment of the present invention.

FIG. 3 is a plan view showing the film with directions for measuring a dimensional change thereof according to the embodiment of the present invention. After the electroless plating processing of nickel alloy, that is, before the heat treatment, four evaluation marks were printed onto the film surface. A rate of change in the film size was calculated from distances between the four points before the heat treatment which was measured by an optical microscope (based on the dimensional stability description of JIS C6471), and the measurement value of the distances between the four evaluation marks after the heat treatment. As shown in FIG. 3, an MD direction along a rolling-up direction R of the film and a TD direction were measured, and the average represented the rate of change in the film size by the heat treatment.

As to the evaluation of dimensional stability, based on the method described in the dimensional stability of JIS C6471, the conductor on both sides were removed by the etching, dried retaining at 150° C. for 30 minutes, and then, the above distances between four points were measured. The MD direction which is the rolling-up direction of the film, and the perpendicular TD direction were measured, and the average was assumed the dimensional stability during the conductor etching.

Moreover, in the measurement of the rate of change in the film size, fine openings of diameter of 50 µm were created in the four corners with a laser as the evaluation marks, and the change in the size was measured at the center. The same result was obtained.

Moreover, in the above manufacturing process of the film metal clad laminate, the heat treatment may not be performed after the nickel-phosphorus plating, and rather, performing electroplating processing of copper is performed in advance, and may perform the heat treatment thereafter.

In this case, the drying is performed for 30 minutes at 80° C. after the nickel-phosphorus plating, and the copper electroplating is performed. Thereafter, four evaluation marks are printed to measure the size, and the heating is performed for 10 minutes at 240° C. as the heat treatment. After the heat treatment, the distances between the four evaluation marks were measured again to obtain the rate of change in the film size.

FIG. 4 is a table showing dimensional stability of the metal clad laminate during a conductor etching process. The table shows the dimensional stability during the conductor etching.

In Table, the stress of the electroless plated layers is indicated as plus if it is tension stress, and minus if it is compression stress. Moreover, the change in the size by the heat treatment shows expansion if it is plus, and shrinkage if it is minus.

As to Embodiments 1 and 2, they show the dimensional stability during the conductor etching in the case where Enplate NI-426 of Meltex Inc. was used as the electroless nickel-phosphorus plating solution to make the phosphorus concentration 4.2% and 4.7%, and heat treated after the copper electroplating.

The phosphorus concentration is the result of carrying out the pH adjustment with sulfuric acid or ammonia in the range of pH of 5.5-7.0, to form the film. Moreover, the bath temperature was set to 90° C. Furthermore, plating period was adjusted between 30 seconds to 2 minutes so that the plating thickness becomes 0.3 µm.

Moreover, as to the manufacture of the metal clad laminate, after drying at 80° C. after the electroless nickel-phosphorus plating, the copper electroplating was performed to form copper thickness of 5 µm. Thereafter, the heat treatment was performed for 10 minutes at 240° C.

As to Embodiments 3 and 4, they show the dimensional stability during the conductor etching in the case where Top Nicoron LPH-LF of Okuno Chemical Industries Co., Ltd. was used as the electroless nickel-phosphorus plating solution to make phosphorus concentration of 1.6% and 1.8%, and heat treated after the copper electroplating.

As to the phosphorus concentration, it is the result forming the film by performing pH adjustment with sulfuric acid or ammonia in the range of pH of 5.5-7.5. Moreover, the bath temperature was set to 90° C., and the plating period was adjusted so that the plating thickness becomes 0.3 µm.

Moreover, as to the manufacture of the metal clad laminate, after drying at 80° C. after the electroless nickel-phosphorus plating, the copper electroplating was performed to form copper with thickness of 5 µm. Then, the heat treatment was performed for 10 minutes at 240° C.

As to Embodiments 5 and 6, the dimensional stability during the conductor etching is shown in the case where Enplate NT-426 of Meltex Inc. was used as the electroless nickel-phosphorus plating solution, the phosphorus concentration was set to 4.2% and 4.7%, and heat treated after the electroless nickel-phosphorus plating.

As to the phosphorus concentration, it is the result of carrying out the pH adjustment with sulfuric acid or ammonia in the range of pH of 5.5-7.0, to form the film. Moreover, the bath temperature was set to 90° C. Furthermore, the plating period was adjusted between 30 seconds and 2 minutes so that the plating thickness becomes 0.3 µm.

Moreover, as to the manufacture of the metal clad laminate, the heat treatment was performed for 10 minutes at 240° C., after forming the nickel-phosphorus film by the electroless nickel-phosphorus plating. Thereafter, copper electroplating was performed to form copper having thickness of 5 µm.

As to Embodiments 7, 8, and 9, they show the dimensional stability during the conductor etching in the case where Top Nicoron LPH-LF of Okuno Chemical Industries Co., Ltd. was used as the electroless nickel-phosphorus plating solution, the phosphorus concentration was set to 1.6%, 1.8%, and 1.9%, and heat treating after the electroless nickel-phosphorus plating.

The phosphorus concentration is the result of carrying out the pH adjustment with sulfuric acid or ammonia in the range of pH of 5.5-7.5 to form the film. Moreover, the bath temperature was set to 90° C. Furthermore, the plating period was adjusted so that plating thickness becomes 0.3 µm.

Moreover, as to the manufacture of the metal clad laminate, the nickel-phosphorus film was formed by the electroless nickel-phosphorus plating, and thereafter, the heat treatment was performed for 10 minutes at 240° C. Thereafter, the copper electroplating was performed to form copper having thickness of 5 µm.

As to Embodiments 10 and 11, similar to Embodiment 9, Top Nicoron LPH-LF of Okuno Chemical Industries Co., Ltd. was used as the electroless nickel plating solution, and the phosphorus concentration was set to 1.9% to form the film having thickness of 0.3 µm. Then, it was dried at 80° C. to form copper having thickness of 1 µm. Then, the heat treatment was performed for 10 minutes at 240° C. After the heat treatment, the copper electroplating was further performed so that the thickness of copper became 5 µm.

As to Embodiments 12 and 13, they show the dimensional stability during the conductor etching in the case where Melplate NI-865 of Meltex Inc. was used as the electroless nickel-phosphorus plating solution, the phosphorus concentration was set to 6.5% and 7.6%, and the heat treatment was performed after the electroless nickel-phosphorus plating.

As to the phosphorus concentration, it is the result of carrying out the pH adjustment with sulfuric acid or ammonia in the range of pH of 4.7-4.9 to form the film. Moreover, the bath temperature was set to 90° C. Furthermore, the plating period was adjusted between 30 seconds and 2 minutes so that the plating thickness becomes 0.3 μm. Moreover, as to the manufacture of the metal clad laminate, the heat treatment was performed for 10 minutes at 240° C., after forming the nickel-phosphorus film by electroless nickel-phosphorus plating. Then, the copper electroplating was performed to form copper having thickness of 5 μm.

As to Comparison Examples 1 and 2, they show the dimensional stability during the conductor etching in the case where Enplate NI-426 of Meltex Inc. was used as the electroless nickel-phosphorus plating solution, the phosphorus concentration was set to 2.2% and 1.5%, to perform the heat treatment after the copper electrolytic plating.

As to the phosphorus concentration, it is the result of carrying out the pH adjustment with sulfuric acid or ammonia in the range of pH of 6.5-7.5 to form the film. Moreover, the bath temperature was set to 80° C. Furthermore, the plating period was adjusted so that the plating thickness becomes 0.3 μm.

Moreover, as to the manufacture of the metal clad laminate, after drying at 80° C. after the electroless nickel-phosphorus plating, the copper electroplating was performed to form copper having thickness of 5 μm. Then, the heat treatment was performed for 10 minutes at 240° C.

As to Comparison Examples 3 and 4, they show the dimensional stability during the conductor etching in the case where Omni Shield 1580 of Rohm and Haas Company as the electroless nickel-phosphorus plating solution, the phosphorus concentration was set to 5.5% and 6.2%, and the heat treatment was performed after the electroless nickel-phosphorus plating.

As to the phosphorus concentration, it is the result of carrying out the pH adjustment with sulfuric acid or ammonia. Moreover, the bath temperature was set to 90° C. Furthermore, the plating period was adjusted so that the plating thickness becomes 0.3 μm. Moreover, as to the manufacture of the metal clad laminate, the heat treatment was performed for 10 minutes at 240° C., after forming the nickel-phosphorus film by the electroless nickel-phosphorus plating. Then, the copper electroplating was performed to form copper having thickness of 5 μm.

As to Comparison Example 5 and 6, they show the dimensional stability during the conductor etching in the case where Cuposit Copper Mix 328L of Rohm and Haas Company was used as the electroless copper plating solution, and the heat treatment was performed after the electroless copper plating.

The plating period was adjusted so that the plating thickness becomes 0.3 μm. Moreover, as to the manufacture of the metal clad laminate, the heat treatment was performed for 10 minutes at 240° C., after forming the copper film by the electroless copper plating. Then, the copper electroplating was performed to form copper having thickness of 5 μm.

As to the Comparison Examples 7, 8 and 9, the electroless nickel plating was performed using NIMUDEN LPX manufactured by C. Uyemura & Co., Ltd. as the electroless plating solution. As to the phosphorus concentration, it is the result of carrying out the pH adjustment with sulfuric acid or ammonia to form the film. Moreover, the bath temperature was set to 90° C. Furthermore, the plating period was adjusted so that the plating thickness becomes 0.3 μm. Moreover, as to the manufacture of the metal clad laminate, after forming the film, the heat treatment was performed for 10 minutes at 240° C. Then, the copper electroplating was performed to form copper having thickness of 5 μm.

Figure 5:
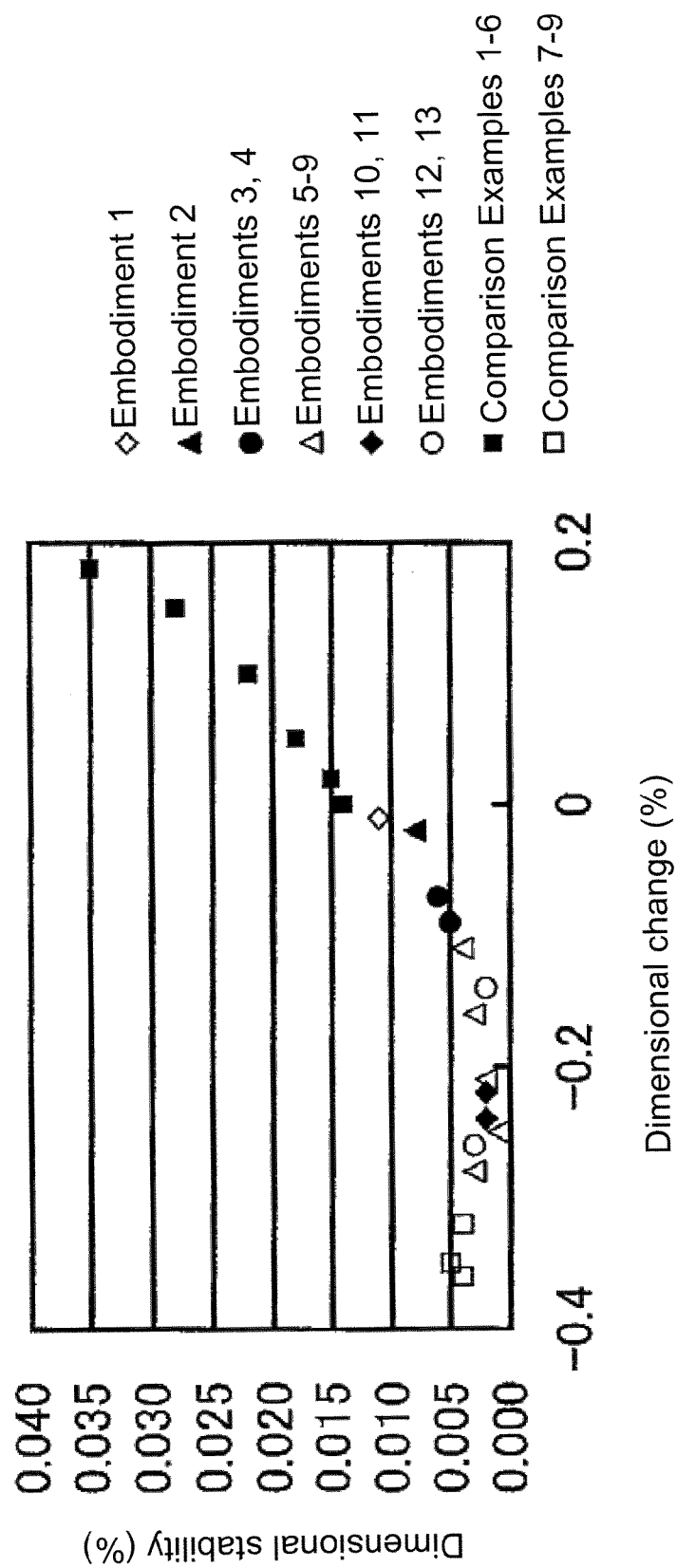
FIG. 5 is a graph showing the dimensional stability of the metal clad laminate during the conductor etching.

FIG. 5 is a graph showing the dimensional stability of the metal clad laminate during the conductor etching.

As to Embodiments 1-13 shown in Table, the dimensional stability during the conductor etching became 0.011% or less by making the stress of the electroless plated layers to a compression stress, and changing it from compression stress to tension stress by the heat treatment. Accordingly, in Embodiment 1-13, metal clad laminates which are excellent in the dimensional stability during the conductor etching were obtained.

Especially, as shown in Embodiments 2-13, when the change in the size due to the heat treatment was shrunk to 0.02%-0.3%, the dimensional stability during the conductor etching became 0.008% or less, and the metal clad laminates which have excellent dimensional stability during the conductor etching were obtained.

Moreover, as shown in Embodiments 5-9, 12 and 13, when the change in the size due to the heat treatment is shrunk to 0.1-0.3%, such as heat treating after the foundation plating, and heat treating after carrying out thin copper plating, etc., after the foundation plating, as shown in Embodiments 10 and 11, the dimensional stability during the conductor etching became 0.004% or less, and the metal clad laminate in which the dimensional stability during the conductor etching was further excellent was obtained.

Moreover, as shown in Embodiments 7-11, when the stress in the film of copper plating which is formed by the electroless plated layers was made into compression stress of 70 MPa or more, the dimensional stability during the conductor etching became 0.003% or less, and the metal clad laminate having further excellent dimensional stability during the conductor etching was obtained.

Moreover, as shown in Comparison Examples 1-6, it was confirmed that the dimensional stability during the conductor etching becomes large, 0.014 or more when the change in the size due to the heat treatment was "no change" or "expansion".

Furthermore, as shown in Comparison Examples 2-6, it was confirmed that the stress of the electroless plated layers is tension stress, the stress is changed from the tension stress to the compression stress by the heat treatment, and the dimensional stability during the conductor etching becomes large, 0.015 or more.

As to the circuit etching characteristics, by partially etching the conductor and measuring the surface resistance between the conductors, the resistance value becomes small and small amount of the residue of the foundation metal remains, and the etching characteristics is not good. Preferably, the nickel-phosphorus concentration of the foundation metal is 6% or less.

Moreover, as shown in Comparison Examples 7, 8 and 9, the stress of the film is compression stress and is large, and if shrinkage of the film becomes 0.3% or more, the swelling defect occurs at the process for electroless plating onto the film top, and it is unsuitable as a product.

Figure 6:
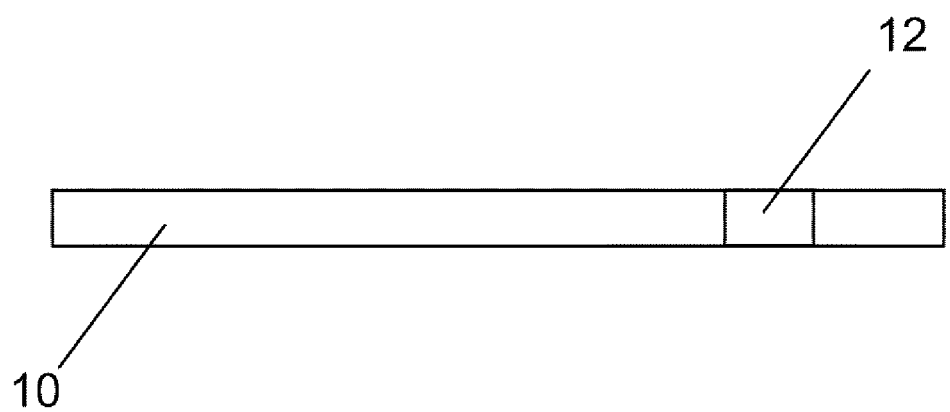
FIG. 6 is a sectional view showing a film of a metal clad laminate according to another embodiment of the present invention.

Next, the result of the through hole reliability examination will be described with reference to Embodiment 14 and Comparison Example 10. FIG. 6 is a sectional view showing a film of a metal clad laminate according to Embodiment 14 of the present invention.

In Embodiment 14, Vecster CT (thickness: 50 μm) manufactured by Kuraray Co., Ltd. was used as the polymer film (liquid crystal polymer film), and the test pattern described in Sample D of Attachment Chart 1.1 of JIS C 5012 was produced. As shown in FIG. 6, a through hole 12 with a diameter of 1 mm was formed in the film by the drill processing, and the metal clad laminate was produced on the same conditions as the above Embodiment 8. Thereafter, thermal shock examination (low temperature and high temperature) was carried out on a condition described in Condition 2 of 9.2.1 of JIS C 5012, and obtained the number of cycle which the resistance of the through hole 12 exceeded 20% of the initial value.

In Comparison Example 10, after producing the metal laminate on the same condition as the above Embodiment 8 without opening the through hole, 1 mm holes were processed by the drill processing, and then, commonly used electroless copper plating was performed, and thereafter, the electrolytic copper plating was performed. Thereby, the test pattern described in Sample D of Attachment Chart 1.1 of JIS C 5012 was produced. Thereafter, the heat shock examination (low temperature and high temperature) was carried out on a condition described in Condition 2 of 9.2.1 of JIS C 5012 to obtain the number of the cycle to which the resistance of the through hole exceeded 20% of the initial value.

Consequently, while the resistance increased 20% after 630 cycles in Comparison Example 10, the resistance did not increase 20% up to 1500 cycles in Embodiment 14. Thus, it was possible to produce reliable printed circuit boards by plating the film surface and the through hole simultaneously after forming the through hole in the film in advance.

Next, the result of the use of other thermoplastic films is shown in Embodiments 15, 16, and 17. In Embodiments 15, 16 and 17, PET, PEN and PEEK were used for the film, respectively. As to the foundation plating, the same processing as Embodiment 5 was performed. That is, Ni—P plating was performed using Meltex Melplate NI-426 so as to obtain the thickness of 0.3 μm, and the heat treatment was performed for 10 minutes at 209° C., 225° C., and 288° C., respectively, and thereafter, the copper plating was performed so as to obtain the thickness of 5 μm.

Here, the changes in the size due to the heat treatment become −0.03%, −0.03% and −0.13%, respectively, and, the changes in the size during the conductor etching also showed good values, 0.007%, 0.007%, and 0.006%, respectively.

What is claimed is:

1. A method for manufacturing a metal clad laminate having a film and a metal layer formed of a foundation layer and an upper layer, comprising the steps of: preparing a plating solution containing phosphorous and having pH of the plating solution between 4.5 and 7.5; forming the foundation layer on at least a part of a surface of the film by electroless plating in the plating solution to obtain a first laminate so that the foundation layer has a thickness about 0.3 um; forming the upper layer on the first laminate by plating to obtain a second laminate; and heating the second laminate to obtain the metal clad laminate, wherein the film is a flexible thermoplastic polymer film, the foundation layer is formed of a nickel alloy containing phosphorous of 6 mass % or less, the upper layer is formed of copper, at least one of the foundation layer and the upper layer has a compression stress before the step of heating the second laminate, and the metal clad laminate shrinks in a planar direction of the film by 0.1% to 0.3% during the step of heating the second laminate.

2. The method for manufacturing a metal clad laminate according to claim 1, wherein said film is a polymer film capable of forming a melting phase having optical anisotropy.

3. The method for manufacturing a metal clad laminate according to claim 1, further comprising the step of forming the foundation layer on at least a part of an inner wall of a through hole formed in the film.

4. A method for manufacturing a metal clad laminate having a film and a metal layer formed of a foundation layer and an upper layer, comprising the steps of:
preparing a plating solution containing phosphorous and having pH of the plating solution between 4.5 and 7.5; forming the foundation layer on at least a part of a surface of the film by electroless plating in the plating solution to obtain a first laminate so that the foundation layer has. a thickness about 0.3 pm; heating the first laminate; and forming the upper layer on the first laminate by plating to obtain the metal clad laminate, wherein the film is a flexible thermoplastic polymer film, the foundation layer is formed of a nickel alloy containing phosphorous of 6 mass % or less, the upper layer is formed of copper, the foundation layer has a compression stress before the step of heating the first laminate, and the metal clad laminate shrinks in a planar direction of the film by 0.1% to 0.3% during the step of heating the first laminate.

5. The method for manufacturing a metal clad laminate according to claim 4, wherein said film is a polymer film capable of forming a melting phase having optical anisotropy.

6. The method for manufacturing a metal clad laminate according to claim 4, further comprising the step of forming the foundation layer on at least a part of an inner wall of a through hole formed in the film.

* * * * *

UNITED STATES PATENT AND TRADEMARK OFFICE
CERTIFICATE OF CORRECTION

| | | |
|---|---|---|
| PATENT NO. | : 8,147,904 B2 | Page 1 of 1 |
| APPLICATION NO. | : 12/556143 | |
| DATED | : April 3, 2012 | |
| INVENTOR(S) | : Satoru Zama and Kenichi Ohga | |

It is certified that error appears in the above-identified patent and that said Letters Patent is hereby corrected as shown below:

Col. 13, line 8 of claim 1: change "foundation layer has a thickness about 0.3 um;" to --foundation layer has a thickness about 0.3 μm;--.
Col. 14, line 9 of claim 4: change "layer has. a thickness" to --layer has a thickness--.
Col. 14, line 9 of claim 4: change "about 0.3 pm;" to --about 0.3 μm;--.

Signed and Sealed this
Thirty-first Day of July, 2012

David J. Kappos
*Director of the United States Patent and Trademark Office*